United States Patent [19]

Minneman et al.

[11] 3,830,651

[45] Aug. 20, 1974

[54] FINE LINE ELECTRONIC MICRO-CIRCUITRY PRINTING PASTES

[75] Inventors: Lester C. Minneman, Maumee; Ralph E. Trease, Toledo; Lowell J. Wells, Toledo; Raymond Louis Dietz, Toledo, all of Ohio

[73] Assignee: Owens-Illinois, Inc., Toledo, Ohio

[22] Filed: May 25, 1970

[21] Appl. No.: 40,359

[52] U.S. Cl. ..................... 106/1, 106/171, 106/186, 106/193 M, 106/203, 117/227, 252/514

[51] Int. Cl. ............................................. C09d 5/24

[58] Field of Search .......... 106/1, 193 M, 311, 171, 106/186, 203; 117/123 B, 124 C, 227; 252/514

[56] References Cited

UNITED STATES PATENTS

| | | | |
|---|---|---|---|
| 3,118,048 | 1/1964 | Fisher et al. | 106/193 X |
| 3,297,460 | 1/1967 | Rau et al. | 106/177 |
| 3,390,104 | 6/1968 | Miller et al. | 117/227 X |
| 3,401,126 | 9/1968 | Miller et al. | 106/1 X |

*Primary Examiner*—Lorenzo B. Hayes
*Attorney, Agent, or Firm*—Richard B. Dence; E. J. Holler

[57] ABSTRACT

A printing paste for fine line electronic circuitry comprising a thixotropic carrier vehicle and an electronically effective material.

23 Claims, No Drawings

FINE LINE ELECTRONIC MICRO-CIRCUITRY PRINTING PASTES

This invention relates to carrier vehicles for printing pastes and pastes made therefrom. More specifically, this invention relates to a unique carrier vehicle for thin line printing of conductor, resistor and dielectric pastes wherein the lines are easily printed and have exceptionally good resolution.

With the advent of integrated microelectronic circuitry and its importance to the electronics industry generally, great attention has been focused upon the need for fine line printing of the various electronic components and arrays within the printed circuit. Generally speaking, printed lines in fine line microelectronic printed circuitry are about 2–5 mils in width and approximately 0.3–1.0 mil in thickness. Furthermore, where a multitude of lines must be presented, the spacing between laterally opposed lines usually is about 2–10 mils. Because of the fineness and close spacing of these lines, it is of paramount importance that high resolution of each line be effected during the printing process and that any tendency to flow laterally after printing be held to an absolute minimum in order to maintain the necessary spacing between adjacent lines.

Printing of fine lines for microcircuitry or other purposes is well-known and generally is effected by the use of a mesh screen or mask which provides a line or pattern of lines of the desired design and width. The electronically effective material such as conductor, resistor, or dielectric is generally applied to the screen or mask in paste form comprising particles of the said material dispersed in an organic liquid vehicle. By means of pressure from above the screen such as by a reciprocating rubber roller, squeegee or the like, the paste is forced through the patterned openings in the screen and printed on a substrate. Drying and firing after printing to remove the vehicle and coalesce the particles of said material results in a line being formed.

The art has had a measure of success in obtaining line resolution and in limiting the lateral flow of printed lines after they are screen printed upon a substrate by formulating printing pastes of sufficiently high viscosity such that after printing, the lines will maintain, within tolerable limits, their original dimensions. Such viscosity is generally provided within the paste by adding a thickening agent thereto.

Unfortunately, the high viscosity necessary to ensure dimensional stability in prior art pastes has attendant therewith the major drawback of adversely affecting the printability of the paste. In some instances, the viscosity is so high that it actually results in a paste which does not freely remove itself from the screen or smooth itself after screen removal, thus resulting in the image of the screen or mask being left in the upper surface of the line. Such an image can materially affect the electronic properties of the ultimately formed line after firing. Furthermore, the use of such high viscosities may be extremely detrimental to the ability to move the paste through the screen or mask since undue force may be required to the detriment of the substrate upon which the line is printed. Undue force of this nature also affects the reproducibility of the line. In addition to these problems, high viscosities usually cause inherent tackiness. Such tackiness causes excessive drag on the squeegee as it traverses the screen or mask surface. Two objectionable effects occur. Firstly, the screen surface is not cleaned sufficiently by the squeegee and secondly, the glue-like paste behaves to keep the screen from lifting quickly behind the squeegee.

In an attempt to overcome the problems attendant with the use of high viscosity, the art has attempted to balance such problems by finding an optimum viscosity for a given system. In achieving such optimization, some degree of line resolution must be sacrificed in order to obtain a paste which is acceptably printable through a screen or mask while at the same time some degree of ease of printing through a screen or mask must be sacrificed in order to obtain acceptable line stability and resolution.

It is clear from the above discussion that there exists a definite need in the art for a printing paste which will provide on the one hand a high degree of resolution and stability especially for the purposes of forming thin line microelectronic circuitry and on the other hand will be particularly easy to print without the need for undue force and with a high degree of reproducibility.

It is a purpose of this invention to fulfill the above-described need in the line printing art generally and more particularly in the fine line microelectronic circuitry art. This is accomplished by unique vehicles for electronic printing pastes, particularly for thin or fine line printing pastes, and by unique pastes made therefrom.

Basically, the carrier vehicles contemplated by this invention comprise an organic liquid vehicle and a thixotrope in an amount sufficient to render the printing pastes thixotropic to the extent that they are easily printable through conventional printing screens or masks but at the same time exhibit sufficiently swift recovery to a sufficient viscosity to maintain line resolution.

Compositions of this invention find their uniqueness, and solve the above-described problem in the art, by using a thixotropic material which because of its thixotropic characteristics enables one to use a highly viscous material to achieve excellent line resolution or definition without fear of postscreening flow, and at the same time, because of the reduction in viscosity which takes place through the shear effect of the screening technique, is easily printed and does not sacrifice printing ability as was required by the pastes of the prior art when high viscosities were employed.

While some of the prior art pastes heretofore used might have been inherently slightly thixotropic because of the type thickening agent used, they were, in general, insufficiently thixotropic to provide the necessary characteristics of printability and line resolution contemplated by this invention. In this respect, the exact degree of thixotropy necessary in a particular system in order to render the paste easily printable and at the same time give good line resolution will of course vary over a wide range depending upon the particular system, the use and environment of the resulting line formed, and the like. Generally speaking, however, this invention contemplates the addition of a thixotropic agent for its thixotropic properties as opposed to adding them only for their viscosity increase properties. For most systems contemplated the amount of thixotropic agent employed may be adequately defined by reference to the screen viscosity index of the paste formed.

The term "screen viscosity index" as used herein is defined as the rest viscosity of the thixotropic paste (i.e., absent shear) divided by the viscosity of the paste during printing (i.e., as it is sheared by passage through the screen or mask). Generally speaking, sufficient thixotropic agent should be added such that the resulting thixotropic printing paste has a screen viscosity index of about 60–1,000, preferably 100–700 and most preferably 150–500. It has been found that when such amounts of thixotropic agents are employed the characteristic of printability is extremely high.

As defined, screen viscosity index is a function of rest viscosity and shear printing viscosity. The exact rest viscosity employed may vary over a large range. Generally speaking, and for most systems contemplated, the rest viscosity of a paste should exceed about 3,000,000 centipoise at 25° C. For any given system, this rest viscosity may be determined by measurement at a shear rate of 1 rpm using a standard Brookfield RVT-Helipath Model C viscometer. Such a measurement procedure has been found to closely approximate true rest viscosity.

Theoretically, there is no upper limit to the rest viscosity which may be used, provided shear viscosity is low enough to allow the paste to be moved through the screen. Practically speaking, however, it is desirable to use rest viscosities of less than about 10,000,000 centipoise at 25° C. measured as above. A preferred range of rest viscosity is about $4 \times 10^6$ to about $7 \times 10^6$ centipoise at 25° C. while a still more preferred range is about $4.5 \times 10^6$ to about $6.0 \times 10^6$ centipoise at 25° C.

The viscosity of the pastes during printing, hereinafter referred to as the shear viscosity may also vary over a wide range depending upon the system employed, the ultimate use of the paste and the like. For fine line printing and for most systems generally contemplated approximate ranges are applicable. Assuming the use of a screen or mask having a mesh size of from 200–400 mesh and assuming the use of a conventional printing technique such as by an air-cylinder driven squeegee at speeds of 5–50 inches per second there is provided in practice, as found by experimentation, a shear rate of about 100–1,000 reciprocal seconds. The shear viscosity normally desired is then in the range of about 10,000–50,000 centipoise at 25° C. preferably 10,000–40,000 centipoise at 25° C. and most preferably 12,000–30,000 centipoise at 25° C. For any given system shear viscosity may be determined by using a ROTO VISCO Cone and Plate viscometer run with an appropriate head assembly to provide a shear rate within the defined range of about 100– 1,000 reciprocal seconds. Such a measurement procedure has been found to closely approximate true shear viscosities. These ranges are, of course, typical since, for example, in theory the lower limit could be much lower than 10,000 centipoise assuming that recovery times were fast enough to maintain line resolution.

While the use of a paste having an appropriate screen viscosity index as defined above ensures improved and generally excellent printability, the pastes must also be provided with a sufficient recovery time and viscosity in order to ensure adequate line resolution. Obviously, the recovery time and viscosity necessary will depend upon each system and the use to which it is put. However, for the purpose of fine line printing, especially for microelectronic circuitry, the term "line resolution" may be defined as that degree of precision with which a line is printed and the maintenance of this precision prior to and during the drying and firing steps. That is to say, this term is used to define the ability of a carrier vehicle printing paste to be printed into a given precise dimension of both width and cross-sectional profile and to maintain that dimension within given industrial limits prior to and during drying and firing of the line. Obviously, the industrial limits will depend upon the type of circuitry, the width of the lines, the spacing between the lines and the like. An example of a typical industrial limit in fine line microelectronic circuitry is an edge flow for each edge of a printed line of 25 percent of the distance between each edge and its adjacent line.

Generally speaking, and for most systems contemplated by this invention, it is preferred when using the pastes for fine line microelectronic circuitry wherein the lines are 2–5 mils in width, 0.3–1 mil thick and are spaced 2–10 mils apart that recovery times from shear viscosity be on the order of about 1 second or less to recovery viscosities on the order of about 2,500,000 centipoise at 25° C. For most systems, recovery viscosity is generally about 90–100 percent of rest viscosity within the 1 second or less recovery time. Such may be approximated for any given system by measurement of the system's rest viscosity as hereinbefore described.

When printed lines are formed using pastes having the above-described characteristics as contemplated by this invention, the lines resulting therefrom are found to be of extremely good resolution and exhibit little or no tendency to flow either immediately after printing or during the drying and firing steps. Thus, the problems experienced by the prior art have been overcome since thixotropy at the given described levels allows for excellent printability without sacrifice of line resolution, and simultaneously, excellent line resolution without sacrifice of printability.

The organic liquids contemplated for use in the carrier vehicles of this invention are any of the well-known organic liquids heretofore used when formulating microcircuitry printing pastes. The properties needed in the organic liquid and, therefore, the type of organic liquid chosen will vary depending upon the ingredients to be added to the liquid, the environment into which the liquid is to be placed and used, and the heat cycle which will be used to fire the printed line and thereby drive off the organic materials.

Examples of organic liquids useful in this invention include butyl Carbitol acetate (diethylene glycol monobutyl ether acetate) iso-amyl salicylate and mixtures thereof; the higher boiling paraffins, cycloparaffins; aromatic hydrocarbons or mixtures thereof; and one or more of the mono and di-alkyl ethers of diethylene glycol or their derivatives. Particularly preferred liquids for the purposes of this invention are butyl Carbitol acetate, iso-amyl salicylate and mixtures thereof.

The thixotropes contemplated for use in this invention include any of the well-known thixotropic agents conventional to the art. Examples of such thixotropic agents include the various swelling clays such as bentonite, an amine treated amount of montmorillonite such as for example dimethyloctadecyl ammonium montmorillonite, bentonite, and the like, calcium silicate, finely divided colloidal alumina or silica, colloidal calcium oxide, and various synthetic and natural polymers such as gums, starches, cellulose derivatives and the like.

Particularly preferred thixotropes for the purposes of this invention are (1) the inorganic thixotrope Cab-O-Sil EH-5 which is a colloidal silica having an ultrafine average particle size of less than about 1–5 microns and preferable 0.015 microns and (2) the organic thixotrope Thixcin E which is a solidified hydrogenated castor oil having a particle size of less than about 50 microns.

In some instances, the vehicles of this invention should have added thereto a binding agent in order to increase the cohesive properties of the resulting paste. Any one of the conventional binding agents may be used, examples of which include ethyl cellulose, hydroxy methyl cellulose, acrylates, polyoxyethylenes, natural gums, synthetic resins, and the like. As can be seen, the binding agent employed may serve not only as a binder but as a thixotrope, and vice versa as well. A particularly preferred binding agent contemplated by this invention is ethyl cellulose which preferably and by conventional nomenclature has a viscosity of N-4 to N-200. While this binding agent also has thixotropic properties, it has been found that in most systems, it cannot be used alone as the thixotrope because in the amounts necessary it renders the paste tacky. Thus, this ingredient is used as a binding agent and as a thixotrope in admixture with other thixotropes.

Gelling agents may be optionally added to the vehicle in order to enhance the ability of the thixotrope to remain in the system and form a paste. Such gelling agents (e.g. surfactants) are well-known in the art and any one thereof may generally be used in the practice of this invention.

Examples of such gelling agents include N-soya trimethylene diamine, oleyl trimethylene diamine, cocoanut primary amine, primary cocoanut amine admixed with crotonic acid, fatty acid amines generally, and the like. Preferred gelling agents for the purposes of this invention include the fatty acid amines such as Adogen 572 made by Ashland Chemical Corp. and the primary cocoanut amines such as Armeen CD made by Amour Industrial Chemical Corp.

The carrier vehicles of this invention may be formulated separately or in situ during formation of the paste. For example, the carrier vehicle may be formulated separately from the electronically effective particulate material and thereafter admixed with said material to form a paste. On the other hand, all ingredients may be admixed together in one operation to form the paste. Preferably the electronically effective material should be added to the carrier vehicle prior to its gelation. This preferred manner of addition has quite surprisingly been found to not only enhance dispersion but to optimize the viscosity characteristics of the pastes as well.

Generally speaking, the carrier vehicle is formed by an admixture of the following ingredients, percentages being by weight

| | |
|---|---|
| Liquid organic (thinner) | 65 – 98% |
| Thixotropic agent | about 0.1 – 10% |
| Binder | about 0 – 35% |
| Gelling agent | about 0 – 0.5% |

A typical paste formulated from the above-described carrier vehicles, as contemplated by this invention, generally comprises said carrier vehicle thoroughly admixed with a particulate electronically effective material comprised of a glassy binder and a conductor, resistor, dielectric, or the like.

Electronically effective materials are well-known in the art and generally speaking all those conventionally used in the known printing pastes are useful herein. In addition, materials thought non-useful because they rendered the prior art pastes unprintable or destroyed line resolution are now, in many instances, rendered useful when employing the concepts of this invention.

Conventionally, and as used herein, the glassy binder is used in an amount of 3–90 percent by weight of the total electronically effective material depending upon the type other material used. Usually when conductors are employed the binder is in an amount of 3–15 percent by weight. When resistors and dielectrics are employed, the weight percent of binder usually is 15–90 percent by weight and 30–90 percent by weight respectively.

Examples of conductor materials include Ag, Au, and alloys such as Pt-Au, Pd-Au, Pd-Ag and the like. Examples of resistors include palladium oxide-silver systems, ruthenium oxide-silver systems, platinum-iridium systems, iridium-gold systems, ruthenium-rhodium systems, thallium oxide systems and the like. Examples of dielectrics include crystallized glasses such as those of the $Li_2O$ — $Al_2O_3$ — $SiO_2$ system, lead barium borosilicate glasses, barium titanate systems and the like.

Examples of glassy binders used in particulate admixture with the conductor, etc. materials include any of the well-known glass binders such as lead borosilicates, lead barium borosilicates and the like. A particularly preferred glass binder for the purposes of this invention and especially when conductors are employed consists of (by weight) 17.6% $SiO_2$, 16.0% $B_2O_3$, 0.4% $Al_2O_3$, 60.0% PbO, and 5.9% CdO. This glass binder may also be admixed with 8.0% $Bi_2O_3$ based upon the weight of said effective material. Generally speaking, the particle size of these electronically effective materials should be less than about 10 microns and preferably less than about 5 microns.

As stated above, and regardless of whether the carrier vehicle is formulated separately from the electronically effective particulate material and thereafter formulated into a paste or the carrier vehicle is formed in situ while making the paste, the resulting paste must be afforded those characteristics hereinabove described. While the range of ingredients will vary widely depending upon the particular system used, generally speaking a carrier vehicle in the above-given weight percentages is admixed with the electronically effective material such that the carrier vehicle is in an amount of from about 10–50 percent by weight of the paste and the electronically effective material is in an amount of from about 50–90 percent by weight of the paste.

An example of a particularly preferred range of ingredients wherein an inorganic thixotrope is employed is:

| | |
|---|---|
| Organic liquid (e.g. a mixture of butyl Carbitol acetate and iso-amyl salicylate | 20–24% by wt. |
| Thixotrope (eg. Cab-O-Sil EH-5) | 0.3–0.8% by wt. |
| Binder (e.g. ethyl cellulose) | 1.5–4% by wt. |
| Gelling agent (e.g. Adogen 572) | 0.06–0.16% by wt. |
| Electronically effective material (e.g. conductor) | 70–80% by wt. |

An example of a particularly preferred range of ingredients wherein an organic thixotrope is employed is:

| | |
|---|---|
| Organic liquid (e.g. butyl Carbitol acetate) | 20–24% by wt. |
| Thixotrope (e.g. Thixcin) | 0.5–1.0% by wt. |
| Binder (e.g. ethyl cellulose) | 1.5–4% by wt. |
| Gelling agent | Not usually employed |
| Electronically effective material (e.g. conductor) | 70–80% by wt. |

The pastes as contemplated by this invention may be formed into printed lines in accordance with any of the well-known and conventional printing techniques. For the purposes of thin or fine line printing for microelectronic circuitry a preferred technique is to screen print the line upon the desired substrate using a screen mesh size of about 165 or 200 to about 400 and a reciprocating squeegee set to reciprocate at a speed of about 5–50 inches per second. Single or multiple coat techniques may be employed. The line so printed is air or sulting line was then dried at about 120°–125° C. for 15–20 minutes and then fired at about 870° C. for 5–10 minutes at peak. The resulting line was then evaluated for its fine line resolution and the paste during printing was evaluated for its printability. The electronically effective materials employed were as follows:

TABLE A

| EXAMPLE NO. | CONDUCTOR (wt.%) | GLASS BINDER (wt.%) |
|---|---|---|
| Examples 1–7 | 70.4% Ag<br>17.6% Pd | 4% Glass<br>8% $Bi_2O_3$ |
| Examples 8–9 | 90% Ag | 3.3% Glass<br>6.7% $Bi_2O_3$ |
| Example 10 | 96% Au | 4% Glass only<br>No $Bi_2O_3$ added |

The glass used as a particulate glass of about 1 micron consisting by weight of 17.6% $SiO_2$, 16.0% $B_2O_3$, 0.4% $Al_2O_3$, 60.0% PbO, and 5.9% CdO. $Bi_2O_3$ was added in

TABLE B

[All percent by wt.]

| Example No. | Organic liquid Type | Organic liquid Amt. (percent) | Binder Type | Binder Amt. (percent) | Thixotrope Type | Thixotrope Amt. (percent) | Gelling agent Type | Gelling agent Amt. (percent) | Screen viscosity index* | Rest viscosity* | Shear viscosity* | Printability | Line resolution |
|---|---|---|---|---|---|---|---|---|---|---|---|---|---|
| 1 | BCA | 82.5 | E.C. | 14.5 | TH | 3 | | | 98.5 | 1,775,000 | 18,000 | Good | Poor. |
| 2 | BCA-IAS, (53.7)-(26.9) | 80.6 | E.C. | 17.0 | CAB | 1.9 | AD | 0.5 | 47.0 | 1,687,500 | 36,000 | do | Do. |
| 3 | BCA-IAS, (52.4)-(26.2) | 78.6 | E.C. | 19.6 | CAB | 1.5 | AD | 0.3 | 55.0 | 3,600,000 | 65,000 | Poor | Good. |
| 4 | BCA | 86.7 | E.C. | 10.4 | TH | 3.0 | | | 321.0 | 4,800,000 | 14,000 | Good | Do. |
| 5 | BCA-IAS, (55.0)-(27.5) | 82.5 | E.C. | 17.5 | | | | | 20.3 | 975,000 | 48,000 | do | Poor. |
| 6 | BCA | 87.5 | E.C. | 10.5 | TH | 2 | | | 93.0 | 2,800,000 | 30,000 | do | Good. |
| 7 | BCA-IAS, (52.1)-(26.0) | 78.1 | E.C. | 19.5 | CAB | 2 | AD | 0.4 | 70.0 | 4,050,000 | 57,000 | Poor | Good. |
| 8 | BCA | 86.6 | E.C. | 10.4 | TH | 3 | | | 211.0 | 4,025,000 | 19,000 | Good | Do. |
| 9 | BCA | 87.3 | E.C. | 6.7 | TH | 6 | | | 295.0 | 7,700,000 | 26,000 | do | Do. |
| 10 | BCA | 86.2 | E.C. | 10.3 | TH | 3.5 | | | 522.0 | 6,800,000 | 13,000 | do | Do. |

*Viscosities were measured as indicated supra., centipoise at 25° C. The recovery viscosity for the examples is approx. 90, 100% of the rest viscosity; recovery times were all less than 1 sec.

BCA=Butyl carbitol acetate.
EC=Ethyl cellulose (Ex. I, 3, 5 and 7—N-4; Ex. 4,6,8, and 10—N-50; and Ex. 9—N-200.
TH=Thixcin E.
IAS=Iso-amyl salicylate (mixtures of BCA and IAS employed in wt. percent as indicated under abbreviations).
CAB=Cab-O-Sil EH-5.
AD=Adogen 572.

oven dried upon the substrate. Such a drying procedure generally comprises first air drying at ambient temperature for about 2–8 minutes followed by oven drying at approximately 100°–125° C. for about 4–20 minutes and preferably about 15 minutes.

After the paste is dried, it is fired at the electronically effective material's firing temperature which in the case of the above-listed conductors, for example, is about 600°–950° C. at peak for 5–8 minutes with a 5–10 minute heat-up and cool-off period. The line so formed is extremely high in resolution.

The following examples are presented by way of illustration rather than limitation.

EXAMPLES

The following pastes were formulated by first adding a binder to an organic liquid in the amounts indicated, with mixing until a solution was formed. To this solution was added with heavy mixing, a thixotrope and thereafter, when used, the gelling agent. To this mixture was added the indicated electronically effective material with rapid stirring. The resulting paste was then screen printed upon a ceramic substrate using a 400 mesh screen or metal mask so as to provide a 2 mil line. A power-operated rubber squeegee was employed averaging a speed of about 8 inches per second. The resome instances, as indicated, as a flux.

EXAMPLE 11

A carrier vehicle was formulated by admixing (by weight) 10.5 percent ethyl cellulose (N-50) with 87.7 percent thinner (organic liquid vehicle) which consisted of 2 parts butyl Carbitol acetate and 1 part isoamyl salicylate until a solution was formed. To this solution was added with mixing 1.5 percent by weight CAB-O-SIL EH-5 until completely dispersed and then there is added thereto 0.3 percent by weight Adogen 572. This vehicle was found to be an extremely effective carrier when used in an amount of 25 percent by weight of a paste wherein the electronically effective material (constituting the remaining 75 percent) consisted of 70.4 percent silver powder of less than 5 microns, 17.6 percent palladium of about 2 microns or less, 8.0% $Bi_2O_3$ as a flux and 4.0 percent glass frit of about 1 micron. The glass frit consisted of 17.6% $SiO_2$, 16.0% $B_2O_3$, 0.4% $Al_2O_3$, 60.0 % PbO, and 5.9% CdO. The conductor paste so formed is suspension stable and was found to be very readily printable, had a rest viscosity of 3,700,000 centipoise at 25° C., and retained excellent line resolution when lines were printed at 2 mil width and about 0.3 mil thickness therefrom at 2 mil spacings.

EXAMPLE 12

A carrier vehicle was formulated by adding 10.7 percent by weight ethyl cellulose (N-50) to 85.3 percent of butyl carbitol acetate and mixing same until a solution is formed. Thereafter 4.0 percent by weight of Thixcin E is added thereto and dispersed at high shear. This vehicle was found to be an extremely effective carrier when used in an amount of 25 percent by weight of a paste wherein the electronically effective material (constituting the remaining 75 percent) consisted of 7 percent by weight palladium powder, 81 percent by weight gold powder, 8% $Bi_2O_3$ as a flux, and 4 percent of the glass frit as used in Example 11. The conductor paste so formed is very suspension stable and was found to be very readily printable and retained excellent line resolution even when lines were printed therefrom at 2 mil spacings.

EXAMPLE 13

A dielectric paste composition which is readily printable and exhibits high design resolution, stability, and control is formulated by admixing a vehicle with a dielectric material having the following weight percent:

| | |
|---|---|
| Vehicle (25% by weight of paste): | |
| (N-50) ethyl cellulose | 10.5% |
| Butyl Carbitol acetate | 87.5% |
| Thixcin E | 2.0% |
| Dielectric (75% by weight of paste): | |
| $ZrSiO_4$ | 52% |
| Glass binder | 48% |

The glass binder use consisted of by weight 37% $SiO_2$, 10% $B_2O_3$, 13% $Al_2O_3$, 15% PbO, 23% BaO, and 2% $TiO_2$.

EXAMPLE 14

In order to illustrate the unique effect of adding an electronically effective material to the carrier vehicles of this invention prior to gellation thereof, two pastes were formulated from the same carrier vehicle consisting of by weight 8.8 percent ethyl cellulose (N-200), and 88.2 percent butyl Carbitol acetate and 3 percent Thixcin E. In the first instance, the carrier vehicle was allowed to gel and thereafter there was added with mixing an electronically effective material consisting of 90 percent Ag powder, 6.7% $Bi_2O_3$ and 3.3 percent of the glass frit used in Example 11. The resulting paste was 80 percent electronically effective material and 20 percent carrier vehicle. The rest viscosity was 1,450,000 centipoise at 25° C.

In the second instance, the same electronically effective material and carrier vehicle in like amounts as in the first instance were admixed similarly as above except that the vehicle carrier was not allowed to gel prior to addition of the electronically effective material. The rest viscosity of the resulting paste was 2,475,000 at 25° C. In addition, mixing was significantly easier in this latter instance than in the former instance. Furthermore, and as indicated by the rest viscosities achieved, the thixotrope was more efficiently utilized in the second instance than in the first.

Once given the above description, many other features, modifications and improvements will become apparent to the skilled artisan. Such features, modifications and improvements are therefore considered to be a part of this invention, the scope of which is to be determined by the following claims:

We claim:

1. A printing paste comprised of an electronically effective material and a carrier vehicle comprising an organic liquid and a thixotrope, said paste having a screen viscosity index of about 60 – 1,000, a rest viscosity of greater than about 3,000,000 centipoise at 25° C, a printing shear viscosity of about 10,000-50,000 centipoise at 25° C and a recovery viscosity of greater than about 2,500,000 centipoise at 25° C.

2. A printing paste according to claim 1 wherein said recovery viscosity is about 90–100 percent of said rest viscosity within 1 second or less.

3. A printing paste according to claim 1 wherein said electronically effective material comprises a glassy binder and a member selected from the group consisting of a conductor, resistor, and dielectric material.

4. A printing paste according to claim 3 which comprises by weight 10–15 percent carrier vehicle and 50–90 percent electronically effective material.

5. A printing paste according to claim 3 which comprises by weight 20–24 percent organic liquid, 0.3–0.8 percent inorganic thixotrope, 1.5–4.0 percent binder, 0.06–0.16 percent gelling agent and 70–80 percent electronically effective material.

6. A printing paste according to claim 5 wherein said electronically effective material comprises a conductor selected from Pd-Au, Pd-Ag, Au, Ag and Pt-Au and a glassy binder.

7. A printing paste according to claim 6 wherein said glassy binder consists of a particulate glass having the following composition by weight: 17.6% $SiO_2$, 16.0% $B_2O_3$, 0.4% $Al_2O_3$, 60.0% PbO and 5.9% CdO.

8. A printing paste according to claim 6 wherein said glassy binder consists of particulate $Bi_2O_3$ and a particulate glass having the following composition by weight: 17.6% $SiO_2$, 16.0% $B_2O_3$, 0.4% $Al_2O_3$, 60.0% PbO and 5.9% CdO.

9. A printing paste according to claim 3 which comprises by weight 20–24 percent organic liquid, 0.5–1.0 percent organic thixotrope, 1.5–4 percent binder and 70–80 percent electronically effective material.

10. A printing paste according to claim 9 wherein said electronically effective material comprises a conductor selected from Pd-Au, Pd-Ag, Au, Ag and Pt-Au and a glassy binder.

11. A printing paste according to claim 10 wherein said glassy binder consists of a particulate glass having the following composition by weight: 17.6% $SiO_2$, 16.0% $B_2O_3$, 0.4% $Al_2O_3$, 60.0% PbO and 5.9% CdO.

12. A printing paste according to claim 10 wherein said glassy binder consists of particulate $Bi_2O_3$ and a particulate glass having the following composition by weight: 17.6% $SiO_2$, 16.0% $B_2O_3$, 0.4% $Al_2O_3$, 60.0% PbO and 5.9% CdO.

13. A printing paste according to claim 4 wherein said electronically effective material comprises by weight 3–90 percent glassy binder and the remainder a particulate material selected from a conductor, resistor and dielectric.

14. A printing paste according to claim 1 in which the carrier vehicle comprises about 65–98 weight percent of a liquid organic solvent selected from the group consisting of diethylene glycol monobutyl ether acetate, isoamyl salicylate and mixtures thereof; about 0.1–10 weight percent of a thixotrope; about 0–35 weight percent of a binding agent; and about 0–0.5 weight percent of a gelling agent.

15. A printing paste according to claim 14 which also includes a binding agent.

16. A printing paste according to claim 15 wherein said binding agent is ethyl cellulose.

17. A printing paste according to claim 15 which also includes a gelling agent.

18. A printing paste according to claim 14 in which the thixotrope is selected from the group consisting of colloidal silica having an ultrafine average particle size of about 0.015 microns and a solidified hydrogenated castor oil having a particle size of less than about 50 microns.

19. A printing paste according to claim 14 in which the binding agent is an ethyl cellulose having a viscosity of N-4 to N-200.

20. A printing paste according to claim 14 in which the gelling agent is a fatty acid amine or a primary cocoanut amine.

21. A printing paste according to claim 14 in which the solvent comprises 2 parts by weight diethylene glycol monobutyl ether acetate and 1 part by weight isoamyl salicylate.

22. A method of producing the paste of claim 1 which includes the step of admixing the electronically effective material with the carrier vehicle before said carrier vehicle gels.

23. A printing paste for forming printed lines in microelectronic circuitry comprising:

a. a carrier vehicle comprising an organic liquid and a thixotrope in an amount sufficient to render a printing paste made therefrom thixotropic to the extent of being printable through a screen or mask and at the same time exhibiting sufficient recovery time and viscosity to maintain the resolution of the lines printed therefrom; and b. an electronically effective material comprising a member selected from the group consisting of a conductor; resistor and dielectric material; and a glassy binder selected from (1) a particulate glass consisting essentially of by weight about: 17.6% $SiO_2$, 16.0% $B_2O_3$, 0.4% $Al_2O_3$, 60.0% PbO, and 5.9% CdO and (2) the particulate glass of (1) and particulate $Bi_2O_3$;

said paste having a screen viscosity index of about 60–1,000, a rest viscosity of greater than about 3,000,000 centipoise at 25° C., a printing shear viscosity of about 10,000–50,000 centipoise at 25° C. and a recovery viscosity of greater than about 2,500,000 centipoise at 25° C.

* * * * *